United States Patent [19]

Cronch et al.

[11] Patent Number: 4,712,076
[45] Date of Patent: Dec. 8, 1987

[54] CIRCUIT FOR PHASE LOCKING A CLOCK SIGNAL TO A SERIES OF PULSES

[75] Inventors: Robert D. Cronch; Larry J. Koudele, both of Oklahoma City, Okla.

[73] Assignee: Magnetic Peripherals Inc., Minneapolis, Minn.

[21] Appl. No.: 923,784

[22] Filed: Oct. 27, 1986

[51] Int. Cl.$^4$ .............................................. H03L 7/08
[52] U.S. Cl. ......................................... 331/16; 331/25
[58] Field of Search ..................... 331/1 A, 10, 15, 16, 331/17, 25

[56] References Cited

U.S. PATENT DOCUMENTS 4,593,254  6/1986  Coburn ............................. 331/1 A Primary Examiner—Eugene R. LaRoche
Assistant Examiner—Robert J. Pascal
Attorney, Agent, or Firm—Robert M. Angus; Joseph A. Genovese

[57] ABSTRACT

A circuit for phase locking a clock signal to a series of data pulses includes a wide band signal generator, a power supply, a flip-flop, a loop filter and a voltage controlled oscillator ("VCO"). The circuit adds current or subtracts current from the loop filter which controls the voltage across the VCO. The voltage across the VCO determines the frequency of the clock signal which it outputs. During the PLO sync zone, the circuit adds or subtracts increased amounts of current from the loop filter during every other pulse to cause greater amounts of correction in the frequency of the clock signal during every other pulse. The wide band signal generator, which includes a component which decays over time, operates only during the PLO sync zone. The circuit uses a flip-flop triggered by each data pulse to either send the current from the wide band signal generator to ground or add it to the constant current level produced by the power supply.

20 Claims, 4 Drawing Figures

CIRCUIT FOR PHASE LOCKING A CLOCK SIGNAL TO A SERIES OF PULSES

BACKGROUND OF THE INVENTION

Phase Lock Oscillators aid in the recovery of data previously stored at discrete time intervals. In many instances the original storage process or later recovery process are not perfectly timed. As a result, a recovered data pulse may not occur at the proper time window. When this occurs, it is necessary to adjust the recovery time windows so that the recovered data pulse occurs during the proper discrete time window, thereby duplicating the data as originally stored.

Phase Lock Oscillators typically include a voltage controlled oscillator which produces the time windows. Other circuitry in the Phase Lock Oscillators shift the position of the time windows so that the recovered data pulse falls into the proper time window. Ideally, when a data pulse occurs within a particular time window it duplicates the original data. If a data pulse falls into the wrong time window an error results. In order to prevent such errors the time windows and the discrete time intervals are synchronized. If the time windows are not synchronized with the discrete time intervals, the pulse may fall into the wrong time window resulting in a read error. Before data is read, a number of uniformly spaced pulses are provided to allow the Phase Locked Oscillator Circuit to shift the time windows so they are in synchronization with the discrete time intervals.

The uniformly spaced pulses are referred to as the PLO sync zone, and are usually recorded at the header of a track or track sector. The process of the Phase Lock Circuit synchronizing the time windows to the discrete time intervals is referred to as locking on. Under some circumstances, presently available Phase Locked Oscillator Circuits function as designed but are unable to synchronize the time windows and the discrete time intervals during the PLO sync zone. For example, in the presence of jitter, when the even pulses occur slightly after the discrete time interval and the odd pulses occur slightly before the discrete time interval, some Phase Lock Oscillator Circuits perform as designed yet produce a continuous pattern of read errors.

One solution to enable the PLO circuit to lock on in the presence of jitter or other similar situations is to phase lock on every other pulse. However, this produces the undesirable result of increasing the normal phase lock on time due to loss of loop gain in the Phase Lock Oscillator Circuit. When the lock on time increases the length of the PLO sync zone increases thereby decreasing the amount of memory space available on the media for data.

Thus, there is a need for a Phase Lock Oscillator Circuit that will quickly synchronize the time windows with the discrete time intervals in the presence of jitter and similar conditions while maintaining the loop gain of the circuit.

SUMMRY OF THE INVENTION

A Phase Locked Oscillator Circuit which biases toward locking on to the even pulses is disclosed. The disclosed circuit adds current to the Phase Locked Oscillator Circuit during every even pulse. The added current causes the voltage controlled oscillator to adjust the phase and frequency toward that of the even pulses.

BRIEF DESCRIPTION OF THE DRAWINGS

For a better understanding of the present invention reference may be had to the accompanying drawings wherein.

These drawings are not intended as a definition of the invention but are provided solely for the purpose of illustrating the preferred embodiment of the invention described below.

DETAILED DESCRIPTION OF THE PREFERRED EMBODIMENT

Briefly, the invention introduces an increased current into a phase lock loop circuit at very specific times. The increased current is introduced during every even pulse in the PLO sync zone. The result is that the increased current associated with every even pulse biases the voltage controlled oscillator toward phase locking onto the even pulses. By introducing increased amounts of current larger phase shifts in the frequency of the read clock are produced while maintaining the loop gain of the circuit. Consequently, the circuit locks on more quickly.

Figure 1:
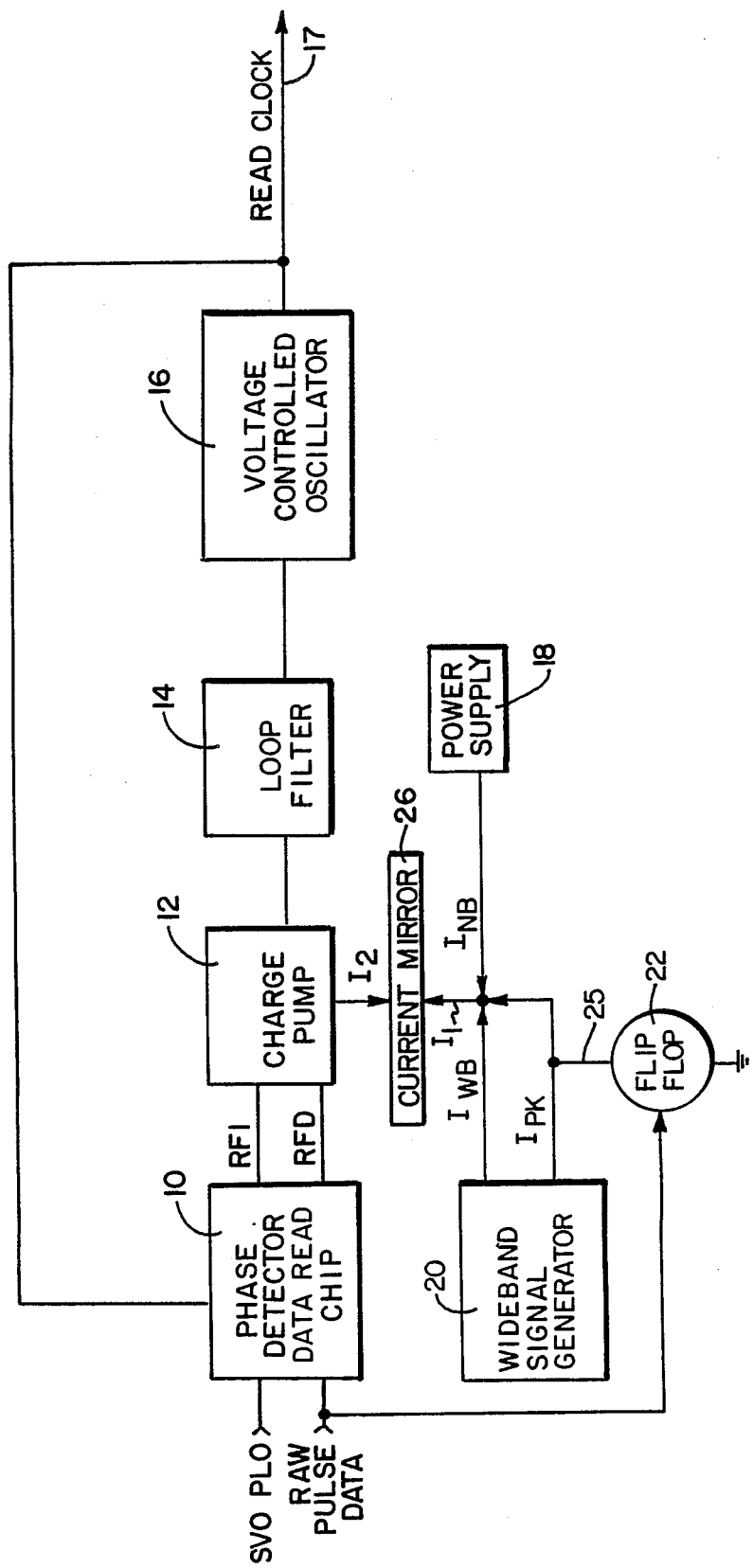
FIG. 1 is a simplified block diagram of the presently preferred embodiment of the invention.

Referring to FIG. 1, the major components of this inventive Phase Lock Oscillator Circuit are disclosed. The circuit includes means for recovering data such as data recovery chip 10, a charge pump 12, a loop filter 14, a voltage controlled oscillator 16 which produces a read clock signal 17, a power supply 18 and means for selectively adding current from a second source such as a wide band signal generator 20. The power supply 18 produces a first source of current, a narrow band current, $I_{NB}$, which is sent to the charge pump 12. $I_{NB}$ flows constantly during the operation of the phase lock oscillator circuit.

The wide band signal generator 20 produces a second source of current during the PLO sync zone comprising a wide band current, $I_{WB}$, and a peak current, $I_{PK}$. $I_{WB}$ is relatively small and is sent to the charge pump 12 throughout the PLO sync zone. $I_{PK}$ is a current which exponentially decays over time. $I_{PK}$ flows into the charge pump 12 during every even pulse occurring within the PLO sync zone. A flip flop 22 is triggered by the data pulse or some other signal indicating each data pulse. The flip flop 22 acts as a switch which alternates between a first position where $I_{PK}$ flows to the charge pump 12 and a second position where $I_{PK}$ flows to ground. Consequently, $I_{PK}$ flows into the charge pump only when the flip flop is in the first position. It should be noted that the time periods during which the flip flop 22 allows $I_{PK}$ to flow to the charge pump 12 are designated as even pulses for the sake of convenience. The times when the flip flop 22 introduces $I_{PK}$ to the charge pump 12 could be also denoted as odd pulses. During every odd pulse the flip flop 22 connects $I_{PK}$ to ground thereby dissipating $I_{PK}$.

The data recovery chip 10 has raw pulse data and servo PLO as inputs. The data read chip 10 has phase detector circuitry which receives the read clock signal 17 and compares it against the sync or data pulses. The leading edge of a data or sync pulse turns on the Read Frequency Increment ("RFI") signal. At the leading edge of the read clock signal 17, the RFI turns off and the Read Frequency Decrement ("RFD") signal turns on. The RFD turns off at the next trailing edge of the read clock signal 17. The RFD signal is essentially constant. The RFI signal varies depending upon where the data pulse occurs. When the data pulses are synchronized with the read clock signal 17, the RFI signal and the RFD signal would cancel out. If the data pulse and the read clock signal are not synchronized a net read frequency increase ("NRFI") or net read frequency decrease ("NRFD") will be produced depending upon whether the read clock signal lags or leads the data pulses. Both of the RFD and RFI signals are input to the charge pump 12.

The charge pump 12 provides a current source for loop filter 14 and adjusts that current depending upon whether an RFI or an RFD signal is input to the charge pump 12. Thus, current from the charge pump 12 is adjusted by the RFI and RFD signals to adjust the voltage to the voltage controlled oscillator 16, thereby changing the frequency of the read clock signal 17 to the data recovery chip 10.

After the data in the PLO sync zone is read and the circuit is locked onto the data, only the narrow band current, $I_{NB}$, is added to or subtracted from the loop filter. When the PLO circuit is operating in the PLO sync zone, the charge pump also adds or subtracts $I_{WB}$ and $I_{PK}$ to or from the current in the loop filter 14.

Adjustments to the current in the loop filter 14 also varies the voltage to the voltage controlled oscillator 16. The variations in voltage and the variations in the frequency of the Voltage Controlled Oscillator are larger in the presence of increased current amounts. Consequently, the corrections in the frequency are larger during the PLO sync zone when $I_{WB}$ and $I_{PK}$ are input into the charge pump 12. The corrections to the frequency are the largest during the even pulses when $I_{PK}$ has a value other than zero.

$I_{PK}$ varies over time. $I_{PK}$ is highest initially and decays exponentially from its initial high value over the time of the PLO sync zone. As a result, the frequency correction will initially be large for the first even pulse and will exponentially decay for successive even pulses over the time of the sync zone. Thus, the PLO circuit will be biased toward phase locking during the PLO sync zone with greatest biasing occurring on the even pulses. Further, the even pulse biasing will decrease exponentially over the time of the PLO sync zone.

Now referring to FIGS. 2 and 3, the details of the circuit and its operation will now be discussed.

Wide Band Current Generator

The wide band current generator 20 controls the magnitude of the increased current $I_{WB}$ and $I_{PK}$ and the time when the increased current is input to the charge pump 12.

A wide band current source 24 produces the additional current. During the PLO sync zone the wide band enable and the read enable signals are set to open transistors Q1 and Q6. Current flows through resistor R7 and through resistor R43. The current flowing through R43 is $I_{WB}$ and the current flowing through R7 is $I_{PK}$. Transistor Q6 varies the emitter-collector current passing through it so that current $I_{PK}$ decays exponentially during the time of the PLO sync zone. Thus, by the end of the PLO sync zone $I_{PK}$ will be reduced to a value dependent on the exponential time constant. Typically it will be close to zero.

The resistor R6 and capacitor C22 control the decay of the read enable signal entering the base of transistor Q6. The read enable signal passes through diode CR2 to charge capacitor C22 which is dissipated by the resistor R6. The result is a read enable signal that decays exponentially over time. Since transistor Q6 acts as an amplifier the current $I_{PK}$ that passes through transistor Q6 also decays exponentially.

The flip flop 22 (not shown in FIG. 2) is connected at lead 25 and is triggered by each data pulse to alternate states. On the odd data pulses, the flip flop 22 closes the circuit to ground thus shorting $I_{PK}$ to ground through lead 25. Thus, during the odd pulses the value of $I_{PK}$ is set to zero. On the even pulses $I_{PK}$, flip flop 22 is set to block $I_{PK}$ current flow through lead 25, so $I_{PK}$ flows through diode CR3. $I_{PK}$ and $I_{WB}$ are summed with $I_{NB}$ coming from power supply 18 and passing through resistor R42 for input to current mirror 26.

Current Mirror

The sum of $I_{PK}$, $I_{WB}$ and $I_{NB}$ equal $I_1$ which passes to a current mirror 26. The current mirror 26 draws equal amounts of current from two inputs. In FIG. 2, $I_1$ is applied to input 9 of the current mirror 26. As a result, $I_2$ is drawn to input 15 of the current mirror 26 from charge pump 12. $I_2$ is equal to $I_1$ and both flow into the current mirror 26. Both current $I_1$ and $I_2$ flow to ground.

Data Recovery Chip

Data pulses and servo PLO data are input to the data recovery chip 10. (See FIG. 1). The data recovery chip 10 receives the read clock signal 17. The data recovery chip 10 includes other phase detector circuitry which detects the various pulses and produces either the read frequency increment or the read frequency decrement signal, depending on whether the read data lags or leads the read clock as is well-known in the art.

Figure 2:
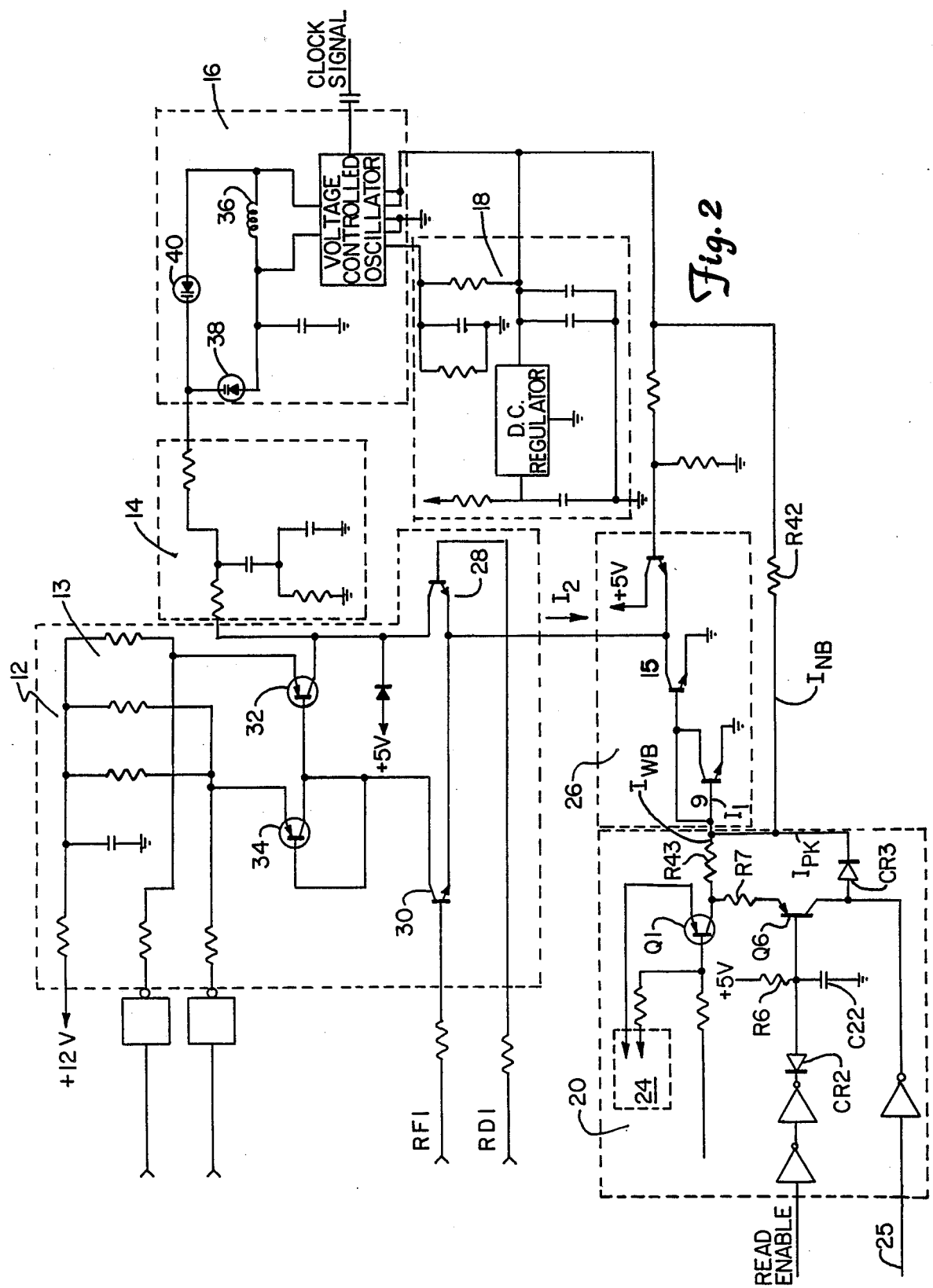
FIG. 2 is a circuit diagram apparatus illustrated in FIG. 1.
Figure 3:
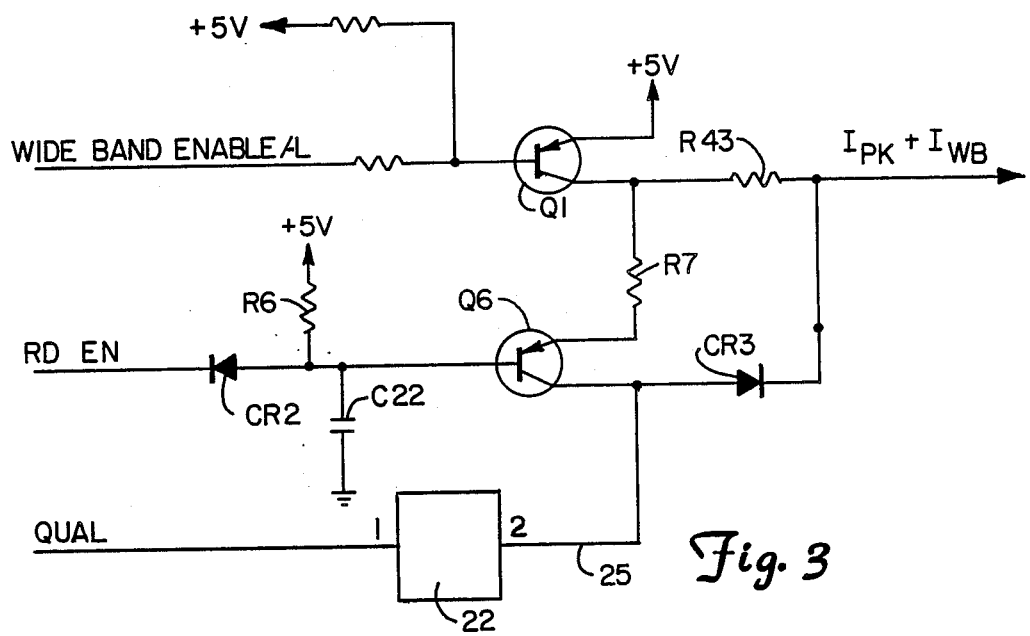
FIG. 3 is a circuit diagram of the wide signal generator portion of the Phase Locked Oscillator Circuit shown in FIG. 2.

In FIG. 2, only the read frequency increment and read frequency decrement signals, the outputs of data chip 10, are shown as inputs to the charge pump 12.

Charge Pump

In operation, the charge pump 12 includes a current source 13 and adds current to or subtracts current from the loop filter 14 based upon whether a read frequency increment or a read frequency decrement signal is input to charge pump 12 from the data recovery chip 10.

Referring to FIG. 2, the charge pump 12 includes a first pair of transistors, 28 and 30, and a second pair of transistors, 32 and 34. The first pair of transistors are identical. Both pair of transistors act as switches. The transistor 30 is opened by a read frequency increment signal from the data recovery chip 10 and the transistor 28 is opened by a read frequency decrement signal from the data recovery chip 10. When transistor 28 opens in response to a read frequency decrement signal it acts as a switch and current $I_2$ flows out of the loop filter 14 through transistor 28 and to input 15 of the current mirror 26. Transistor 32 is closed when the charge pump 12 responds to a read frequency decrement signal and, as a result, no current flows from the current source 13 of the charge pump 12. As a result, current $I_2$ flows from the loop filter 14 when a read frequency decrement signal is input to the charge pump 12.

A read frequency increment signal opens transistor 30. The opening of transistor 30 triggers the opening of both transistor 32 and transistor 34. Current then takes one of two paths from the current source 13 of the charge pump 12. $I_2$ is drawn to pin 15 of the current mirror 26 through one current path. The current $I_2$ flows through transistor 34, through transistor 30 and then to pin 15 of the current mirror 26. The other path is from the current source 13 of the charge pump 12 through transistor 32 and to the loop filter 14. Thus, current travels to pin 15 of the current mirror 26 and to the loop filter 14 when a read frequency increment signal is input to the charge pump 12.

The frequency change in the read clock signal from the voltage controlled oscillator 16 is fed back to the data recovery chip 10 to the phase detector circuitry therein. When the phase detector circuitry in the data recovery chip 10 detects a raw data pulse, a RFI signal followed by an RFD signal is generated. When the width of the RFI signal equals the width of the RFD signal, the raw data pulse is exactly centered in the detection window. When the RFI signal is narrower than the RFD signal, a net RFD signal is produced, indicating that the raw data pulse is late in the detection window. The net RFD signal produces a frequency decrease in the voltage controlled oscillator 16. The net frequency decrease shifts the phase of the read clock 17 in a direction so that the next raw data pulse will be more nearly centered. When the RFI signal is wider than the RFD signal, a "net" RFI signal is produced indicating that the raw data pulse is early in the detection window. The net RFI signal produces a frequency increase which correspondingly shifts the phase of the read clock 17. This phase shift moves the detection window in a direction so that the next raw data pulse will be more nearly centered. These corrections occur continually during a read process. The gain of the PLO in narrow band is not great enough to allow an individual raw pulse to cause any substantial phase shift. Thus, the feedback loop acts to constantly monitor and correct the phase lock oscillating circuit in the read clock.

Loop Filter

The loop filter 14 is an array of resistors and capacitors which control the band width and loop response of the Phase Lock Oscillator Circuit.

Voltage Controlled Oscillator

The current adjustments to the loop filter 14 result in an increase or decrease in the amount of voltage applied to the voltage controlled oscillator 16. The voltage controlled oscillator 16 includes a coil 36, a first varactor 38 and a second varactor 40. The current flowing from the loop filter 14 to the voltage controlled oscillator 16 is stored in the varactor 38, the varactor 40 and the coil 36. The varactors and the coil form an LC circuit and alternately store the energy to produce the operating frequency of the voltage controlled oscillator 16 and the frequency of the read clock signal 17. Changes in the amount of current to the loop filter 14 affect the frequency of the voltage controlled oscillator 16 as the varactors and coil will alternate the different amounts of energy they store at different rates.

Power Supply

The power supply 18 for $I_{NB}$ is a D.C. regulator which regulates a twelve volt input down to a regulated five volt output. The capacitors and resistors in the power supply 18 filter out noise and ripple and produce a regulated wave shape for the voltage controlled oscillator.

Figure 4:
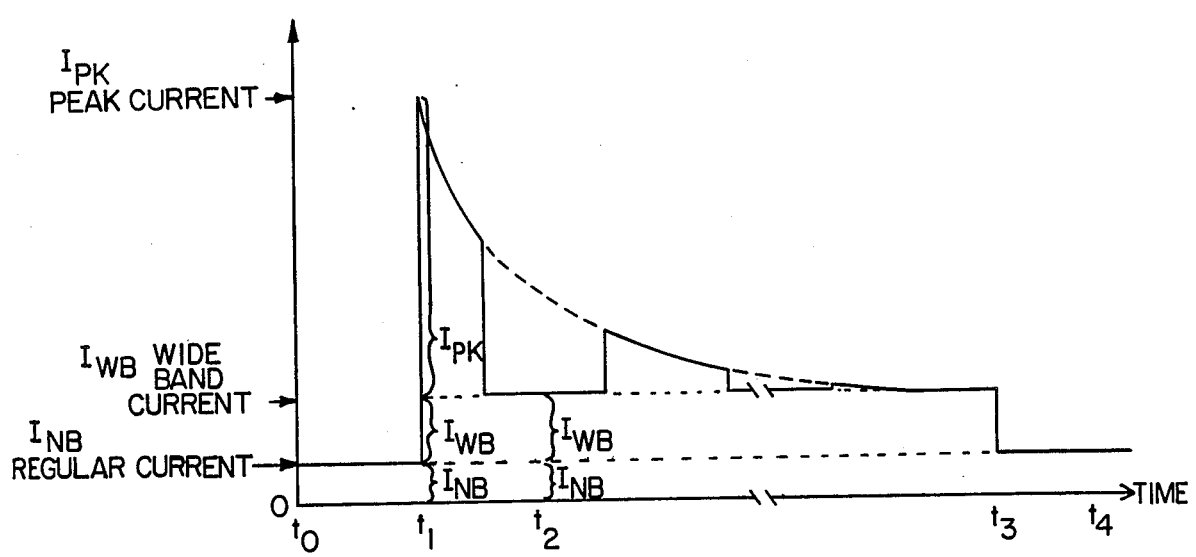
FIG. 4 is a diagram showing the magnitude of the current introduced to the charge pump over a period of time.

Referring to FIG. 4, the magnitude of current $I_1$, which is applied to current mirror 26 (not shown in FIG. 4), is shown graphically as a function of time. The narrow band current, $I_{NB}$, which comes from current supply 18, is constant throughout the operation of the PLO circuit. The wide band current, $I_{WB}$, is turned on during the PLO sync zone. $I_{WB}$ is also constant during the PLO sync zone and is added to $I_{NB}$ during the PLO sync zone.

The peak current, $I_{PK}$, is highest at the beginning of the PLO sync zone and decays throughout the time of the PLO sync zone. $I_{PK}$ is only summed with $I_{WB}$ and $I_{NB}$ when the flip flop 22 is in the position where $I_{PK}$ does not short to ground. When flip flop 22 connects $I_{PK}$ to ground, the value of $I_{PK}$ is zero.

Referring to FIG. 4, the graph can be explained. From $t_0$ to $t_1$ the magnitude of the current equals $I_{NB}$. At $t_1$, the PLO sync zone begins. At $t_1$, the flip flop operates so that $I_{PK}$ is inputted to the current mirror. $I_{WB}$ is also added to the current mirror. As a result the magnitude of the input to the current mirror equals $I_{NB}+I_{WB}+I_{PK}$. At $t_2$, the flip flop closes to ground setting $I_{PK}$ to zero and the magnitude of the current equals $I_{WB}+I_{NB}$. $I_{NB}$ and $I_{WB}$ represent the constant magnitude of current during the PLO sync zone. This cycle repeats as the flip flop switches $I_{PK}$ between the ground and the current mirror. The magnitude of $I_{PK}$ drops as $I_{PK}$ decays over time. At $t_3$, the PLO sync zone has ends and $I_{WB}$ drops to zero. At $t_4$, the current sent to the current mirror equals $I_{NB}$ since the wide band current generator 20 only operates during the PLO sync zone.

It should be noted that the decay function depicted by FIG. 4 is merely illustrative. It should also be understood that the foregoing description of the invention is only illustrative and explanatory thereof, and that other means and techniques can be employed without departing from the full scope of the invention as set forth in the appended claims.

What is claimed is:

1. A circuit for phase locking a clock signal to the phase of a series of sync pulses, comprising:
   means for producing a clock signal having a frequency responsive to a first signal;
   means for comparing the phase of the clock signal to the phase of the series of sync pulses and producing a second signal responsive to the phase relation of the clock signal and the series of sync pulses;
   means for generating a third signal of decreasing value during the presence of the sync pulses;
   means for providing a fourth signal; and
   means for adjusting the level of said first signal in response to the second, third, and fourth signals.

2. The circuit of claim 1 wherein the second signal produced by the comparing means determines the frequency change component of the first signal.

3. The circuit of claim 2 wherein the summation of the third and fourth signals determines the magnitude of the frequency change produced by the first signal.

4. The circuit of claim 1 wherein said means for generating a third signal further comprises:

a substantially constant signal portion;

a means for shorting a signal to ground upon every other sync pulse;

a decaying signal portion electrically connected to the shorting means so that the decaying signal portion drops to zero on every other sync pulse, the substantially constant signal portion and the decaying signal portion being summed to produce to the third signal.

5. The circuit of claim 4 wherein said signal shorting means includes a flip flop acting as a switch which alternates between an open position and a closed position connected to ground.

6. The circuit of claim 1 wherein the comparing means produces said second signal when the clock signal is out of phase with the series of sync pulses.

7. The circuit of claim 1 wherein the second signal comprises a read frequency increment signal and a read frequency decrement signal, said circuit further including summing means for summing said read frequency increment signal and said read frequency decrement signal to produce a net read frequency increment signal when the clock signal lags the sync pulses and a net read frequency decrement signal when the clock signal leads the sync pulses.

8. The circuit of claim 7 wherein said clock signal producing means is a voltage controlled oscillator responsive to a voltage signal, and means responsive to said first signal to vary said voltage signal to the voltage controlled oscillator thereby varying the frequency of the read clock signal.

9. The circuit of claim 8 wherein said responsive means causes the voltage signal applied to the voltage controlled oscillator to increase in response to a read frequency increment signal to increase the frequency of the read clock and causes the voltage signal applied to the voltage controlled oscillator to decrease in response to a read frequency decrement signal to decrease the frequency of the read clock.

10. The circuit of claim 1 wherein the fourth signal producing means comprises a power supply producing a substantially constant level of current during the operation of the circuit.

11. A circuit for phase locking a clock signal with a series of sync pulses comprises:

oscillator means responsive to a control signal for producing and varying the frequency of the clock signal;

means for comparing the phase of the clock signal with the phase of the sync pulses and producing a correction signal when the clock signal is out of phase with the sync pulses;

a source of first current a source of second current providing additional current in the presence of the series of sync pulses;

means for adding said correction signal, said first current and said second current to produce said control signal, said second current added during alternative pulses of the series of sync pulses, whereby the oscillator means corrects the phase of the clock signal toward the phase of the series of sync pulses in response to the control signal.

12. The circuit of claim 11 wherein the size of the correction to the phase of the clock signal toward the phase of the series of sync pulses varies with the magnitude of the sum of the first current and the second current.

13. The circuit of claim 11 wherein the magnitude of the second current decays exponentially over time.

14. The circuit of claim 11 wherein said phase comparing means includes a data recovery chip receiving the sync pulses, and wherein the correction signal output from the data recovery chip includes read frequency increment and read frequency decrement.

15. The circuit of claim 14 wherein said adding means sums the first and second currents and increases the voltage of the control signal in response to a read frequency increment.

16. The circuit of claim 14 wherein said adding means sums the first and second currents and decreases the voltage of the control signal in response to a read frequency decrement.

17. The circuit of claim 15 wherein the oscillator means includes a voltage controlled oscillator which responds to a read frequency increment by increasing the frequency of the read clock.

18. The circuit of claim 16 where the oscillator means includes a voltage controlled oscillator which responds to a read frequency decrement by decreasing the frequency of the read clock.

19. A circuit for phase locking a clock signal to the phase of a series of sync pulses, comprising:

a voltage controlled oscillator which produces the clock signal;

a phase detector which receives the clock signal and compares the frequency of the clock signal with the frequency of the sync pulses, the phase detector producing a net read frequency increase when the clock signal lags the sync pulses and producing a net read frequency decrease signal when the clock signal leads the sync pulses;

means for adjusting voltage near the voltage controlled oscillator which receives the net read frequency increase and net read frequency decrease signals;

a current generator which operates in the presence of the series of sync pulses which produces a decaying signal that is introduced to the means for adjusting voltage during every other sync pulse, whereby the means for adjusting the voltage near the voltage controlled oscillator depends on the decaying signal from the current generator and the signal from the phase detector charge the voltage in the circuit near the voltage controlled oscillator so that the frequency of the clock signal moves into phase with the frequency of the sync pulses.

20. The circuit of claim 19 wherein the magnitude of the decaying signal from the current generator is related to the magnitude of the phase shift of the read clock and the signal from the phase shift determines the direction to the phase shift.

* * * * *